(12) United States Patent
Dolganov et al.

(10) Patent No.: US 12,176,680 B2
(45) Date of Patent: Dec. 24, 2024

(54) SQUARE PULSE LASER DRIVER FOR VERTICAL CAVITY SURFACE EMITTING LASER ARRAYS

(71) Applicant: Lumentum Operations LLC, San Jose, CA (US)

(72) Inventors: Mikhail Dolganov, Gilroy, CA (US); Hao Huang, San Jose, CA (US); Lijun Zhu, Dublin, CA (US)

(73) Assignee: Lumentum Operations LLC, San Jose, CA (US)

( * ) Notice: Subject to any disclaimer, the term of this patent is extended or adjusted under 35 U.S.C. 154(b) by 795 days.

(21) Appl. No.: 17/305,138

(22) Filed: Jun. 30, 2021

(65) Prior Publication Data

US 2022/0224074 A1 Jul. 14, 2022

Related U.S. Application Data

(60) Provisional application No. 63/199,602, filed on Jan. 11, 2021.

(51) Int. Cl.
| | |
|---|---|
| *H01S 3/00* | (2006.01) |
| *H01S 5/042* | (2006.01) |
| *H01S 5/183* | (2006.01) |
| *H01S 5/42* | (2006.01) |
| *H03K 17/687* | (2006.01) |

(52) U.S. Cl.
CPC ............ *H01S 5/0428* (2013.01); *H01S 5/183* (2013.01); *H01S 5/423* (2013.01); *H01S 2301/206* (2013.01); *H03K 17/687* (2013.01)

(58) Field of Classification Search
CPC ........ H01S 5/0428; H01S 5/183; H01S 5/423; H01S 2301/206
See application file for complete search history.

(56) References Cited

U.S. PATENT DOCUMENTS

| | | | |
|---|---|---|---|
| 2006/0291512 A1* | 12/2006 | Borschowa | H01S 5/0683 372/38.07 |
| 2017/0040770 A1* | 2/2017 | Gyoten | H01S 5/0428 |
| 2019/0025406 A1* | 1/2019 | Krelboim | H01S 5/062 |
| 2019/0229493 A1* | 7/2019 | Stern | H01S 5/0428 |
| 2021/0305770 A1* | 9/2021 | Colles | H01S 5/0428 |
| 2022/0011410 A1* | 1/2022 | Huang | H03K 3/53 |

* cited by examiner

*Primary Examiner* — Kinam Park
(74) *Attorney, Agent, or Firm* — Harrity & Harrity, LLP (57) ABSTRACT

In some implementations, an electrical drive circuit may include a first optical load terminal to receive an anode of a first optical load. The electrical drive circuit may include a junction section that includes a first electrical junction and a second optical load terminal to receive a cathode of the first optical load and an anode of a second optical load. The electrical drive circuit may include a third optical load terminal to receive a cathode of the second optical load; a first switch connected between the third optical load terminal and a common ground; a coupling capacitor connected between the first electrical junction and a second electrical junction; a second switch connected between the second electrical junction and the common ground; and an inductor connected from a second branch of the second electrical junction and between the second electrical junction and the common ground.

20 Claims, 9 Drawing Sheets

SQUARE PULSE LASER DRIVER FOR VERTICAL CAVITY SURFACE EMITTING LASER ARRAYS

CROSS-REFERENCE TO RELATED APPLICATION

This Patent Application claims priority to U.S. Provisional Patent Application No. 63/199,602, filed on Jan. 11, 2021, and entitled "LOW RIPPLE LASER DRIVE." The disclosure of the prior Application is considered part of and is incorporated by reference into this Patent Application.

TECHNICAL FIELD

The present disclosure relates generally to lasers and laser drivers and to electrical drive circuits for driving a laser load of a vertical cavity surface emitting laser (VCSEL) to emit a square shaped optical pulse using multiple switches.

BACKGROUND

Time-of-flight-based (TOF-based) measurement systems, such as three-dimensional (3D) sensing systems, light detection and ranging (LIDAR) systems, and/or the like, emit optical pulses into a field of view, detect reflected optical pulses, and determine distances to objects in the field of view by measuring delays and/or differences between the emitted optical pulses and the reflected optical pulses. For some applications, a rectangular shaped pulse may be emitted into a field of view. TOF-based measurement systems are but one application of rectangular shaped optical pulses. A rectangular shaped pulse (also referred to as a "square shaped pulse", a "square wave", or a "pulse wave", among other examples) is a non-sinusoidal periodic waveform in which an amplitude alternates at a steady frequency between fixed minimum and maximum values. In an ideal rectangular shaped pulse, transitions between the minimum and maximum values are instantaneous or near-instantaneous.

An electronic driver, which may also be referred to as an "electrical drive circuit", provides current and voltage to an optical load to cause the optical load to generate optical pulses. An electronic driver for rectangular pulses provides current and voltage to an optical load to cause optical pulses from the optical load to approximate a rectangular shape. Rise-time, fall-time, overshoot, and ripple are examples, among others, of imperfections in the current, voltage, and/or optical pulse that prevent an electronic driver from causing an optical load to provide an ideal rectangular shaped optical pulse.

VCSELs may be used individually and/or in VCSEL arrays as the optical load for the aforementioned 3D sensing applications or other applications. VCSELs may be used for generating structured light (e.g., in flood illuminators), time-of-flight (TOF) measurement beams, and/or the like to enable 3D sensing applications or other applications. The VCSELs generate optical pulses, such as rectangular shaped pulses, to provide beams that may be used for facial recognition, gesture recognition, and/or the like. VCSELs may be included in smart phone devices, gaming devices, sensing devices, and/or the like.

A VCSEL array may include multiple VCSELs arranged in a particular configuration. For example, a VCSEL array may be arranged with a square grid of VCSELs, a radial grid of VCSELs, a hexagonal grid of VCSELs, a variable spacing grid of VCSELs, a random grid of VCSELs, and/or the like. A particular beam profile may be obtained for a collective output of the VCSEL array (e.g., multiple beams that, at a distance greater than a Rayleigh distance, collectively form a beam) via selection of a corresponding VCSEL array configuration. Parameters of a VCSEL may affect an emission pattern (e.g., a near field emission pattern or a far field emission pattern) of the VCSEL, which may affect operations of a system that includes the VCSEL and/or operations of a VCSEL array that includes the VCSEL. A single die may include one or more VCSEL arrays. A single die including multiple VCSEL arrays may physically separate the arrays or may intermix emitters of different VCSEL arrays. In some cases, all emitters in a VCSEL array operate at a common wavelength (e.g., all emitters in an example VCSEL array may operate at 940 nanometers (nm) or another wavelength that is the same for all the emitters).

SUMMARY

According to some implementations, an electrical drive circuit may include a first optical load terminal to receive an anode of a first optical load; a junction section that includes a first electrical junction and a second optical load terminal to receive a cathode of the first optical load and an anode of a second optical load; a third optical load terminal to receive a cathode of the second optical load; a first switch connected between the third optical load terminal and a common ground; a coupling capacitor connected between the first electrical junction and a second electrical junction; a second switch connected between the second electrical junction and the common ground; and an inductor connected from a second branch of the second electrical junction and between the second electrical junction and the common ground.

According to some implementations, an electrical drive circuit may include a first optical load terminal for receiving an anode of a first optical load; a first electrical junction point that comprises second optical load terminal for receiving a cathode of the first optical load and for receiving an anode of a second optical load; a third optical load terminal for receiving a cathode of the second optical load; a first electrical path from a common ground, through a first auxiliary capacitor, the first optical load terminal, the first electrical junction point, a coupling capacitor, a second electrical junction point, an inductor, a second auxiliary capacitor and back to the common ground; a second electrical path from the common ground through the second auxiliary capacitor, the inductor, the second electrical junction point, the coupling capacitor, the first electrical junction point, the second optical load, the third optical load terminal, and a first switch, and back to the common ground; and a second switch connected between the second electrical junction point and the common ground.

According to some implementations, a method may include setting, by a controller, a first switch of an electrical drive circuit to an off state and a second switch of the electrical drive circuit to an on state to charge an inductor of the electrical drive circuit; and setting, by the controller, the first switch of the electrical drive circuit to an on state and the second switch of the electrical drive circuit to an off state to discharge electrical current from the inductor into a second optical load, wherein the inductor is connected between an electrical junction and a voltage source, such that: a first alternating current flows through a first auxiliary capacitor, a first optical load, a coupling capacitor, the inductor and a second auxiliary capacitor, and a second alternating current flows through the second auxiliary capacitor, the inductor, the coupling capacitor, the second optical load, and the first switch.

DETAILED DESCRIPTION

The following detailed description of example implementations refers to the accompanying drawings. The same reference numbers in different drawings may identify the same or similar elements.

Time-of-flight-based (TOF-based) measurement systems, such as 3D sensing (3DS) systems, LIDAR systems, and/or the like, emit optical pulses into a field of view, detect reflected optical pulses, and determine distances to objects in the field of view by measuring delays and/or differences between the emitted optical pulses and the reflected optical pulses. Some systems may have a relatively high pulse repetition rate or modulation frequency (e.g., up to 200 megahertz (MHz)). TOF-based measurement systems may include an electrical drive circuit (e.g., a laser driver) to control the provision of current and voltage to an optical load (e.g., a laser diode, a semi-conductor laser, a VCSEL, a VCSEL array, and/or the like) to emit optical pulses into a field of view. The optical load may also be termed a "laser load." The optical pulse may be a rectangular shaped pulse (also referred to as a "square pulse," a "square wave," "a square wave shape," or a "pulse wave," among other examples) that is a non-sinusoidal periodic waveform in which an amplitude alternates at a steady frequency between fixed minimum and maximum values, ideally with instantaneous or near-instantaneous transitions between the minimum and maximum values. Some use cases may allow a non-steady frequency and/or non-periodic (e.g., irregular or random) triggering of electrical pulses, such as to achieve differing rise times, differing pulse amplitudes, or differing pulse timings, among other examples.

In general, emitting an optical pulse that has a well-defined origin in time and a rectangular shape may improve measurement precision and accuracy (e.g., as compared to optical pulses having a non-rectangular shape, a long rise time, a poorly-defined origin in time, and/or the like). To achieve such a rectangular shape, an emitted optical pulse should generally have a short rise time (e.g., a time during which power of the optical pulse is rising) and a short fall time (e.g., a time during which power of the optical pulse is falling). For example, the rise time of an optical pulse may be a time during which power of the optical pulse rises from 10% of peak power to 90% of peak power and may be referred to as a "10%-90% rise time". Similarly, the fall time of an optical pulse may be a time during which power of the optical pulse falls from 90% of peak power to 10% of peak power and may be referred to as a "90%-10% fall time". Thus, it may be advantageous to design an electrical drive circuit that minimizes rise time. Additionally, to ensure a rectangular shaped pulse, it may be advantageous to design an electrical drive circuit that minimizes ripple. In some configurations, multiple electrical drivers may be deployed to achieve a minimized rise time with a rectangular shaped pulse. However, such configurations that minimize rise time and/or achieve a rectangular shaped pulse may cause an undesirable level of electrical power usage and/or loss.

Some implementations described herein provide a method and/or an electrical drive circuit for driving a laser or optical load to emit a rectangular shaped optical pulse using multiple switches. When using multiple switches, some implementations described herein may include, among other components, a first and second laser load, a first switch and second switch, and a coupling capacitor and an inductor to store and charge current. When the first switch is opened and the second switch is closed, the inductor may be charged. When the first switch is closed and the second switch is opened, the inductor may discharge a direct current into the second laser load with a short rise time and a slow fall time and another direct current is received at the first laser load, from a main voltage source, with a slow rise time. Subsequently, when the first switch is opened and the second switch is closed, the first optical load may cease emitting with a short fall time and the inductor may be charged again. In this way, an optical pulse output, collectively, from the first laser load and the second laser load has a short rise time, a low ripple (resulting in a rectangular shape), and a short fall time. For example, as described herein, the first and second laser load may be driven to emit an optical pulse that has a short rise time (e.g., less than 1 nanosecond (ns), less than 100 picoseconds (ps)), a short fall time (e.g., less than 1 ns, less than 500 ps, less than 300 ps, and/or the like), and/or a flat top of the pulse.

A total electrical power loss may be less than prior art. For example, some implementations described herein may use an electrical drive circuit that includes a driver, a first connection point, a first laser load, a second connection point, a second laser load, and a third connection point (where the first laser load is between the first and second connection points, and the second laser load is between the second and third connection points). In this case, the first connection point may serve as an anode for the first laser load, the second connection point may serve as a cathode for the first laser load and an anode for the second laser load, and the third connection point may serve as a cathode for the second laser load. As a result, a single driver may drive two laser loads (the first laser load's rise time may be delayed relative to the second laser load's rise time by a half of a resonance frequency period) to achieve, in combination, for example, a square pulse with the rise time of less than 100 ps, for example. Moreover, based at least in part on achieving an optical pulse with a relatively short rise time, a rectangular shape, and a low level of electrical losses, an electrical drive circuit described herein may be used, for example, for 3DS applications with a relatively high pulse repetition rate or modulation frequency (e.g., a modulation frequency of up to 200 MHz).

Figure 1A:
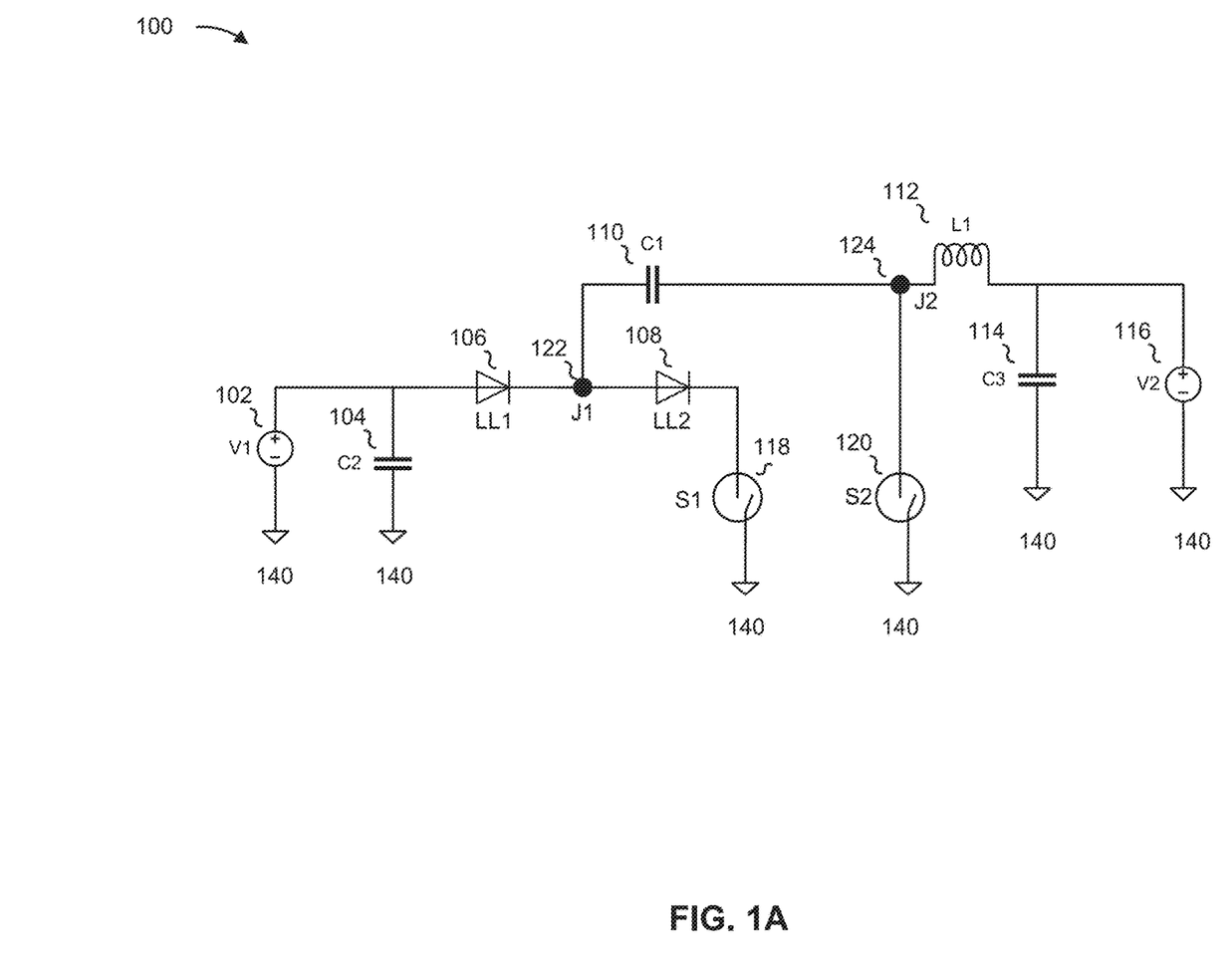
FIGS. 1A-1D are diagrams of example electrical drive circuits described herein with connected optical loads.

FIGS. 1A-1D are circuit diagrams of an example electrical drive circuit 100/100'/100"/100'" described herein with connected optical loads. As shown in FIG. 1A, the electrical drive circuit 100 may include a first voltage source 102 (connected to a common ground 140), a capacitor 104 (an auxiliary capacitor connected to the common ground 140 and in parallel with the first voltage source 102), a first laser load 106, a second laser load 108, a capacitor 110 (a coupling capacitor), an inductor 112, a capacitor 114 (an auxiliary capacitor connected to the common ground 140 and in parallel with a second voltage source 116), the second voltage source 116 (connected to the common ground 140), a first switch 118 (connected to the common ground 140), and a second switch 120 (connected to the common ground 140). In some implementations, first switch 118 may be a high-speed switch, such as a high-speed field electrical transistor (FET) switch (with a switching speed of less than 1 nanosecond (ns)). In some implementations, second switch 120 may be a high-speed switch, such as a high-speed FET, or a low-speed switch, such as a low-speed FET (with a switching speed of less than 5 ns). Other types of switches may be possible.

In some implementations, the electrical drive circuit 100 may include a first electrical junction 122 (in a junction section between first laser load 106 and second laser load 108) and a second electrical junction 124. Although some implementations are described herein in terms of a particular set of components, additional components, fewer components, or a different combination of components may be possible.

In some implementations, voltage sources 102/116 may include a direct current (DC) voltage source, a regulator, a DC-DC converter, an alternating current (AC)-DC converter, or another type of source to supply a DC voltage. In some implementations, voltage sources 102/116 may include capacitors 104/114, respectively. In some implementations, first laser load 106 and/or second laser load 108 may include a component to emit an optical pulse. For example, first laser load 106 and/or second laser load 108 may include a laser diode, a VCSEL, an edge emitter, a multi junction laser, a semi-conductor laser, a semi-conductor laser load, a semi-conductor laser diode, or an array thereof, among other examples. First laser load 106 may include a first quantity of emitters, and second laser load 108 may include a second quantity of emitters that is approximately equal to the first quantity of emitters in quantity or output optical power (e.g., to achieve approximately equal optical power outputs, as described herein). In some cases, first laser load 106 and second laser load 108 may have approximately equal optical power outputs, which may include achieving approximately the same peak output power at respective peaks during an optical pulse and/or achieving approximately the same total output power during an entirety of an optical pulse (e.g., with different optical power/time responses).

In some implementations, the first laser load 106 and the second laser load 108 are provided separately or independently from the electrical drive circuit 100. This is common where the electrical drive circuit is manufactured and/or sold independently of the lasers. In some implementations, the first laser load 106 and/or the second laser load 108 may be integrated into the electrical drive circuit 100. In some implementations, an integrated circuit may be created that includes some components of the electrical drive circuit 100 and either or both of the laser loads 106/108. In some implementations, a multi-VCSEL array may include a first VCSEL array that includes the first laser load 106, and a second VCSEL array that includes the second laser load 108. In some implementations, the emitters of different lasers of a multi-VCSEL array are interspaced.

In some implementations, electrical drive circuit 100 may be provided in a particular form factor. For example, discrete components of electrical drive circuit 100 may be assembled together on a printed circuit board and/or substrate. Additionally, or alternatively, one or more of the components of electrical drive circuit 100 may be integrated as a monolithic driver integrated circuit (e.g., semi-conductor) chip. In some implementations, one or more components of electrical drive circuit 100 may be partially integrated with a laser load 106/108. In some implementations, the electrical drive circuit 100 may be assembled on a single substrate and integrated into a single device. Accordingly, the electrical drive circuit 100 may include an interface for a laser load 106/108 that may include one or more connection points, electrodes, traces, and/or other elements to connect a laser load 106/108 to the electrical drive circuit 100, depending on the particular form of electrical drive circuit 100. In some implementations, electrical drive circuit 100 and/or a laser load 106/108 may include or interface with one or more passive optical elements (not shown), such as a lens, a diffuser, or a transparent cover, among other examples. For example, first laser load 106 may be disposed within a threshold proximity of second laser load 108, such that the laser loads 106/108 share the same passive optical element (e.g., the same lens or diffuser). Locating the first laser load 106 and the second laser load 108 proximate to one another is advantageous to minimize differences in the field of view between each laser load. If there was a large spacing between the two laser loads 106/108, the arrival time of light from the two lasers in the coplanar plane could differ at extreme angles of the field of view causing the shape of the optical pulse to distort (e.g., a sloped or tilted top of the optical pulse). Thus, collocating first laser load 106 and second laser load 108 may improve an angular spread of the field of view.

As further shown in FIG. 1A, first electrical junction 122 forms two branches of electrical drive circuit 100. A first branch off first electrical junction 122 includes second laser load 108 and switch 118. A second branch off first electrical junction 122 includes capacitor 110 and second electrical junction 124. In the second branch off first electrical junction 122, one end of second electrical junction 124 is connected to capacitor 110 and the other end of second electrical junction 124 defines two branches off electrical junction 124. For example, a first branch off second electrical junction 124 includes second switch 120. A second branch off second electrical junction 124 includes inductor 112, capacitor 114, and the second voltage source 116. In the second branch 172 off second electrical junction 124, one end of the inductor 112 is connected to the second electrical junction 124 and the other end of the inductor 112 is connected to the capacitor 114 and the second voltage source 116 while the capacitor 114 and the second voltage source 116 are also connected in parallel with a common ground. This configuration enables driving of first laser load 106 and second laser load 108 with a single charged inductor driver that provides a current to both laser loads 106/108 (time-shifted based on discharge of inductor 112 and operation of coupling capacitor 110) to cause a rectangular shaped (e.g., square shaped) pulse to be emitted.

In some implementations, first laser load 106 may be associated with a first operating wavelength (e.g., 940 nanometers (nm) or 1.5 millimeters (mm), among other examples) and second laser load 108 may be associated with a second operating wavelength that is approximately equal to the first operating wavelength, such as within +1-10% of the first operating wavelength. In this case, based on the first operating wavelength being approximately equal to the second operating wavelength, a collective output of the first laser load 106 and the second laser load 108 may be combined to form a rectangular shaped pulse.

Figure 1B:
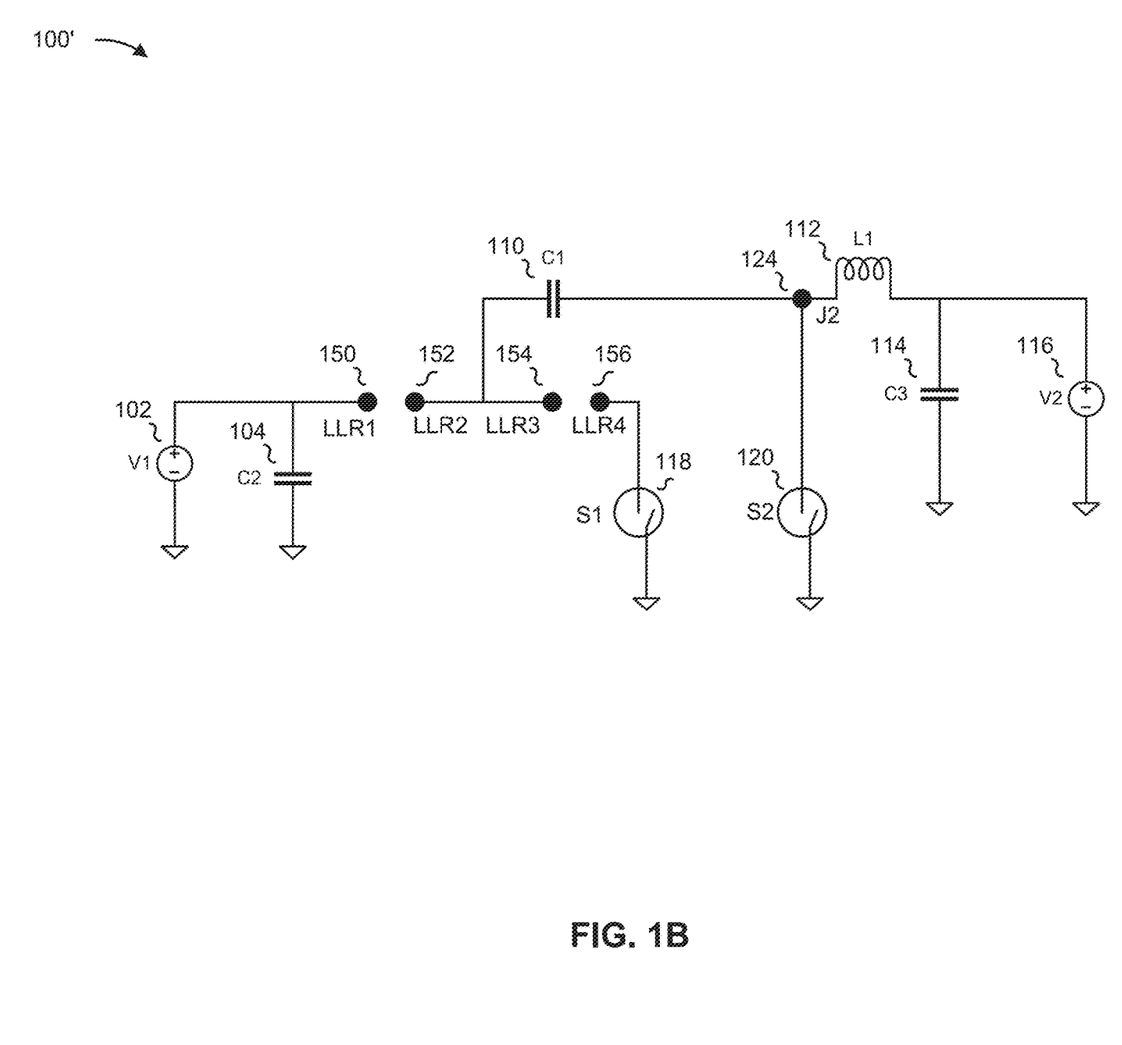

FIG. 1B shows an example electrical drive circuit 100' configured for receiving two laser loads, such as two optical diode sources. As shown in FIG. 1B, electrical drive circuit 100' includes a set of laser load receivers (LLRs) 150-156.

For example, a first laser load receiver (LLR1) 150 and a second laser load receiver (LLR2) 152 may receive a first laser load (e.g., first laser load 106). Similarly, a third laser load receiver (LLR3) 154 and a fourth laser load receiver (LLR4) 156 may receive a second laser load (e.g., second laser load 108). Laser load receivers 150/152 and 154/156 may be pads or other electrical connection points that may receive a laser load (e.g., during assembly of an optical device, manufactured laser loads may be attached to a separately manufactured electrical drive circuit). In some implementations, LLR2 and LLR3 may be a common pad or other electrical connection point that may receive a first laser load and a second laser load.

Figure 1C:
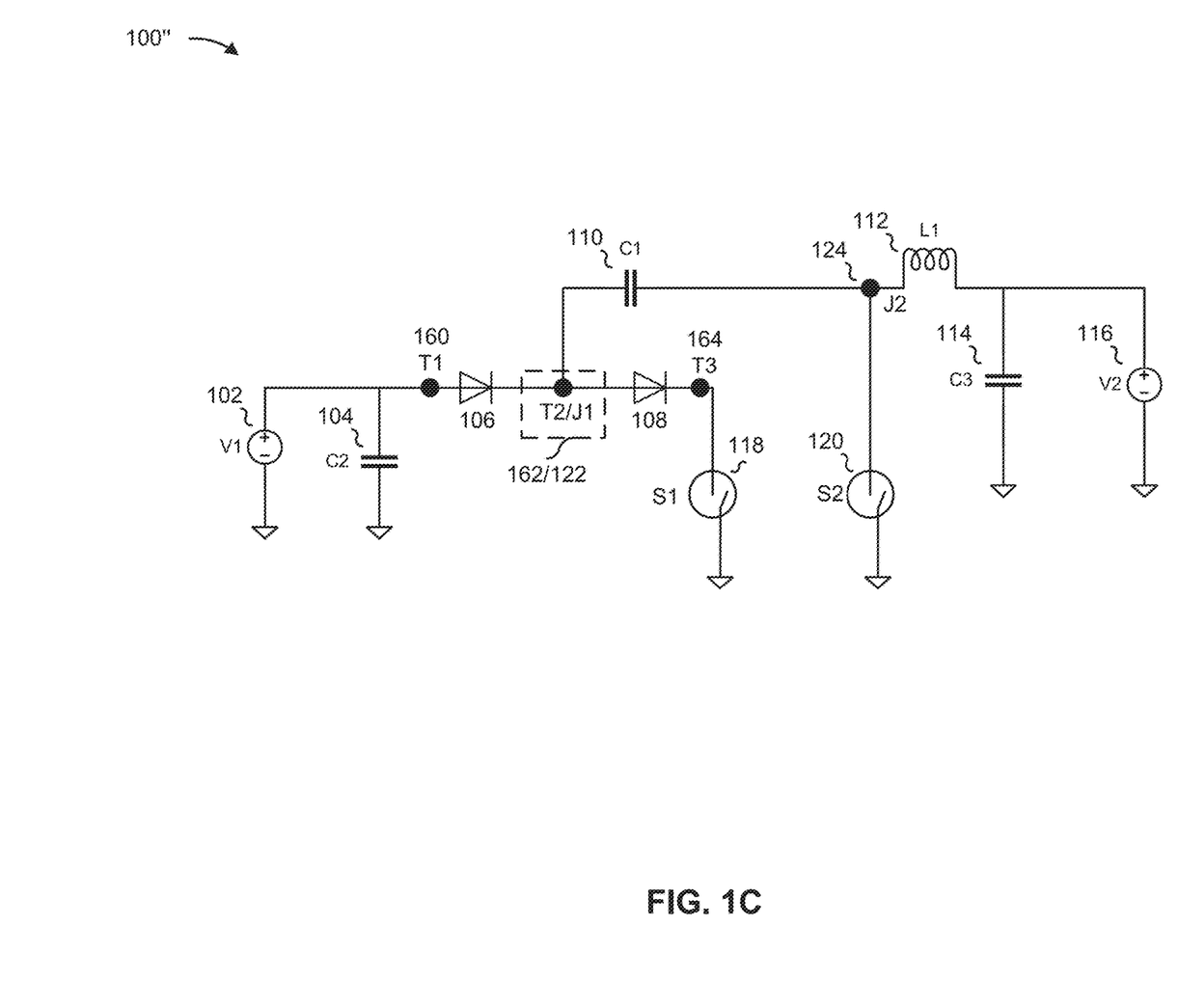

FIG. 1C, shows an example electrical drive circuit 100″ configured with a set of optical load terminals. As shown in FIG. 1C, electrical drive circuit 100″ includes a first optical load terminal 160 to receive an anode of a first laser load (e.g., first laser load 106), a second optical load terminal 162 to receive a cathode of the first laser load and an anode of a second laser load (e.g., second laser load 108), and a third optical load terminal 164 to receive a cathode of the second laser load. Second optical load terminal may be disposed in a junction section that includes a first electrical junction (e.g., first electrical junction 122).

Figure 1D:
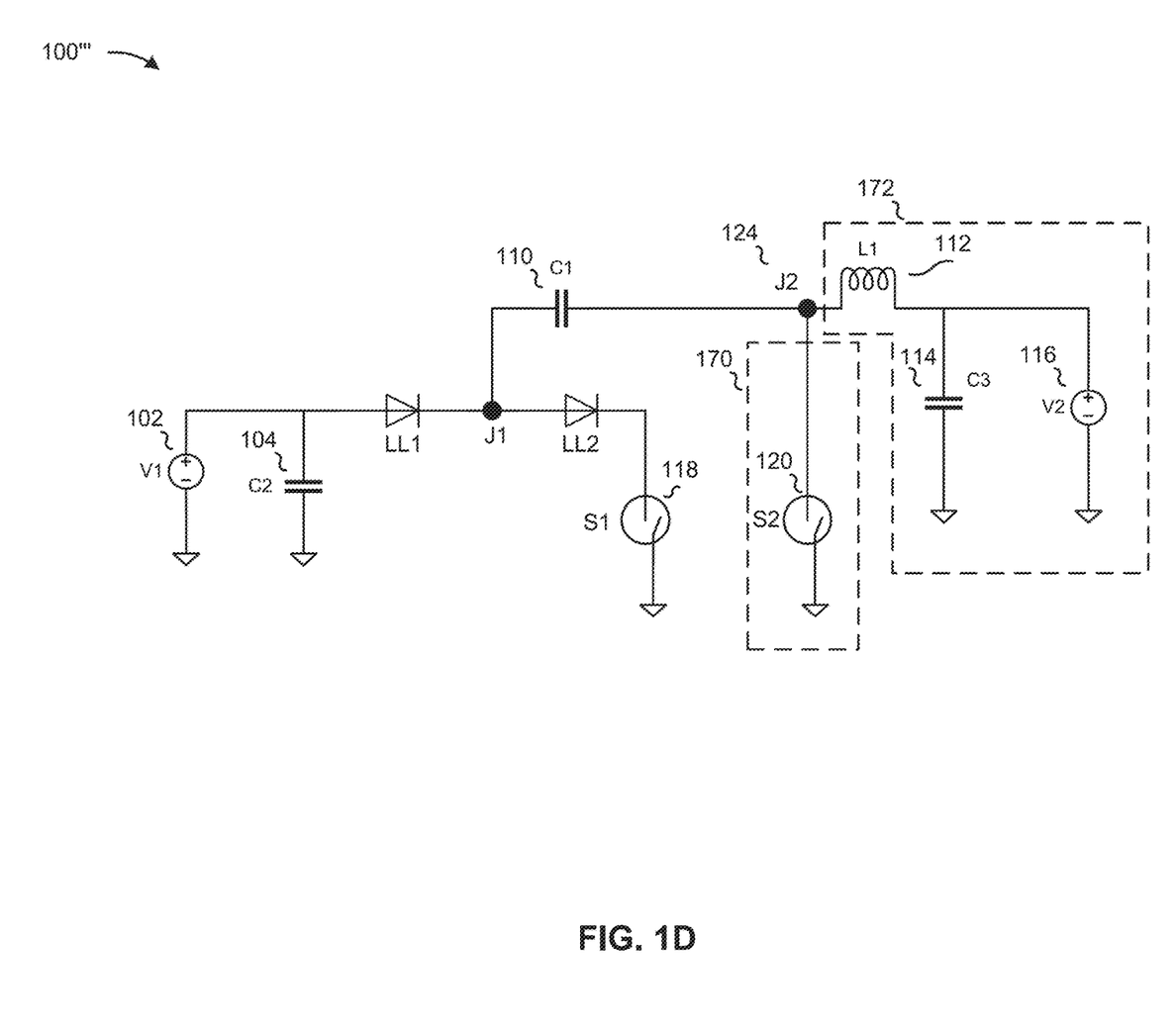

FIG. 1D, shows an example electrical drive circuit 100‴ configured with a set of branches off of a second electrical junction (e.g., second electrical junction 124 defines a first branch and a second branch). For example, a first branch 170 off the second electrical junction includes a second switch (e.g., second switch 120) and a second branch 172 off the second electrical junction includes an inductor (e.g., inductor 112), a capacitor (e.g., capacitor 114), and a voltage source (e.g., the second voltage source 116). In the second branch 172 of FIG. 1D, one end of the inductor 112 is connected to the second electrical junction 124 and the other end of the inductor 112 is connected to the capacitor 114 and the second voltage source 116 while the capacitor 114 and the second voltage source 116 are also connected in parallel with a common ground.

As indicated above, FIGS. 1A-1D are provided as examples. Other examples may differ from what is described with regard to FIGS. 1A-1D.

Figure 2:
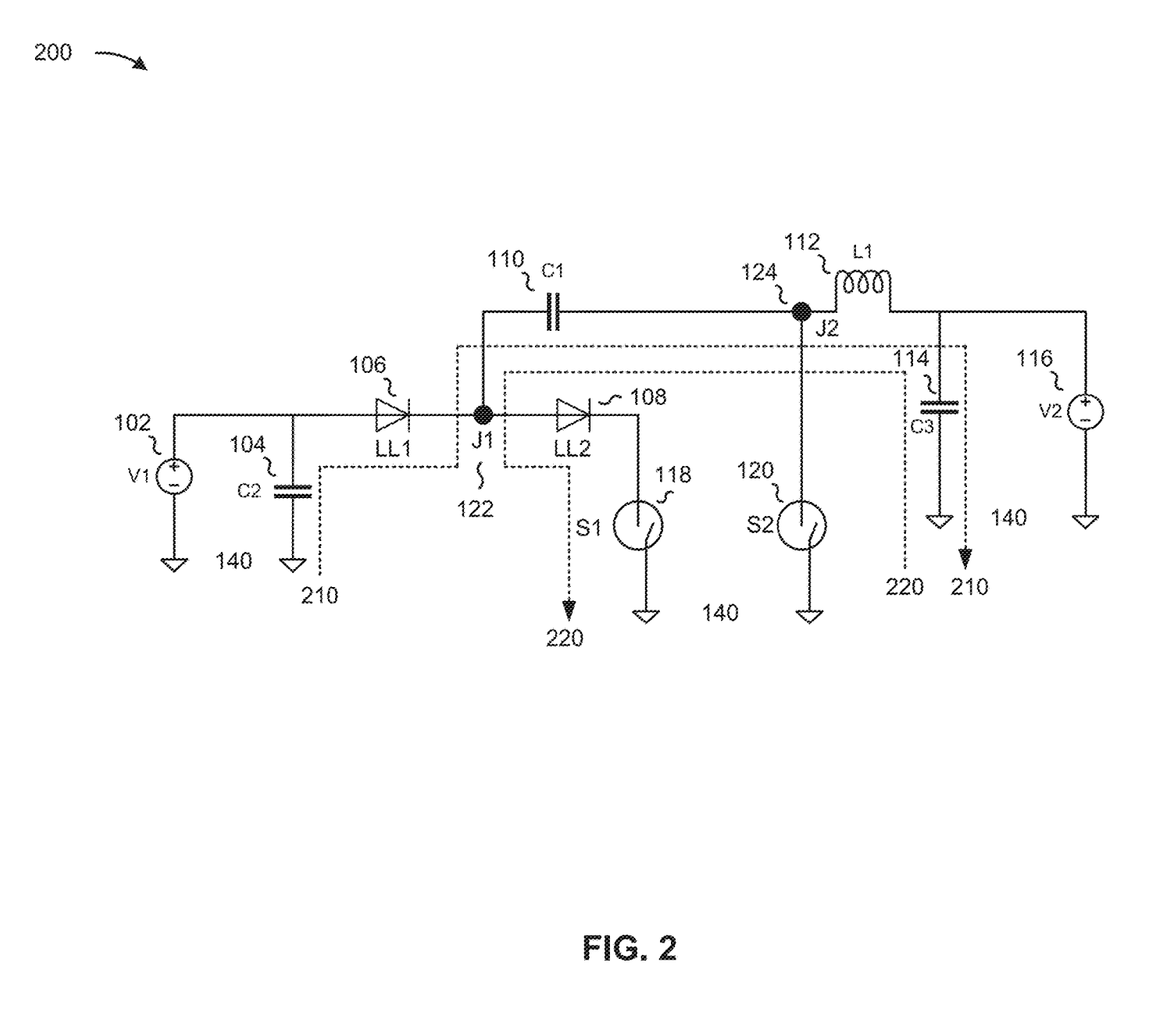
FIGS. 2-4 are diagrams of example current flows through electrical drive circuits described herein with connected optical loads.

FIG. 2 is a diagram of an example 200 of a current flow through the electrical drive circuit 100 described herein with connected optical loads.

As shown in FIG. 2, electrical drive circuit 100 may have a first AC current flow path 210 and a second AC current flow path 220. First AC current flow path 210 may convey first AC electrical current and extend from the common ground 140 to capacitor 104, to first laser load 106, to first electrical junction 122, to capacitor 110, to second electrical junction 124, to inductor 112, to capacitor 114, and to the common ground 140. Second AC current flow path 220 may convey second AC electrical current and extend from the common ground, to capacitor 114, to inductor 112, to second electrical junction 124, to capacitor 110, to first electrical junction 122, to second laser load 108, to first switch 118, and to the common ground 140.

Figure 5:
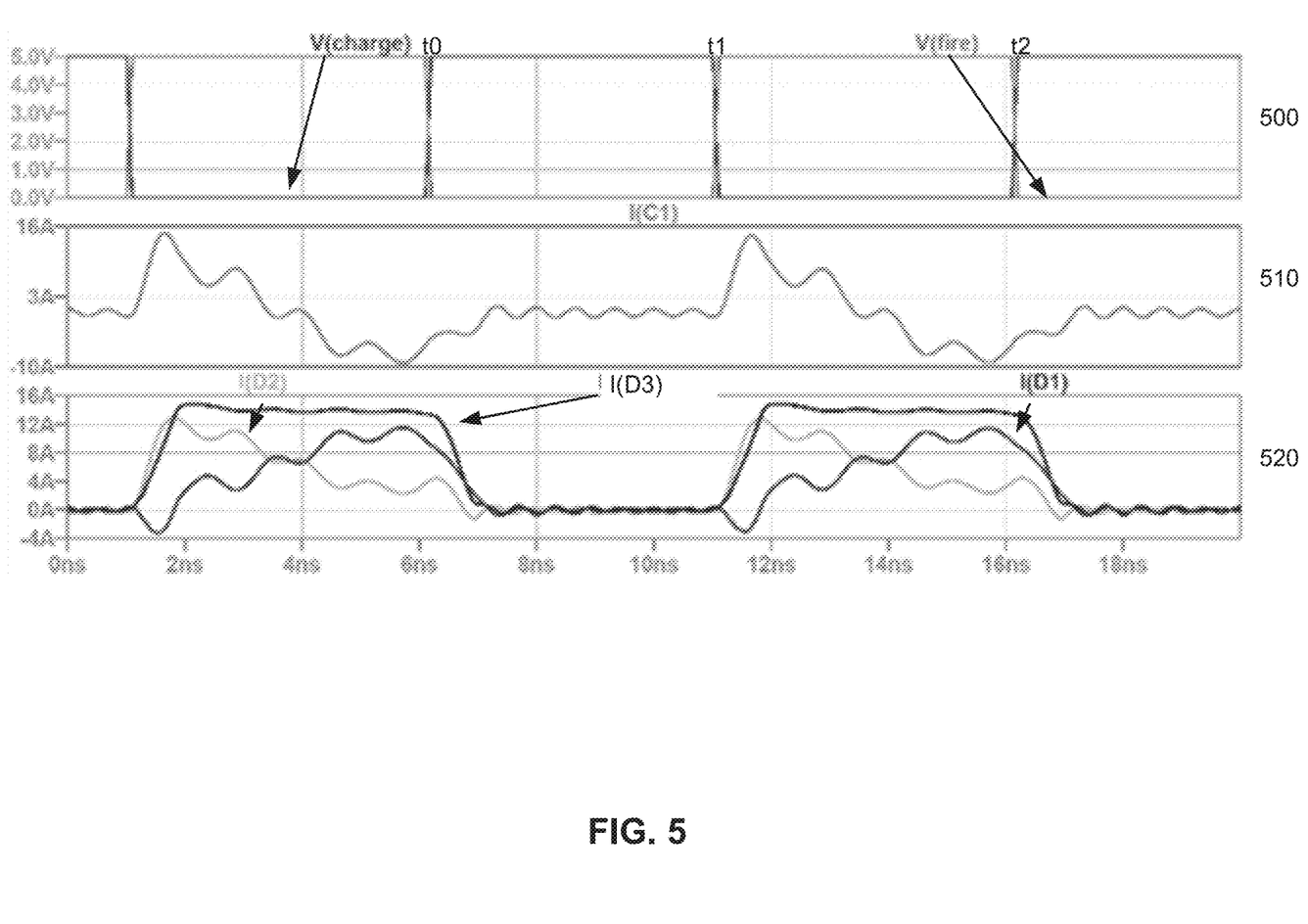
FIG. 5 is a diagram of example plots related to the performance and/or operation of an electrical drive circuit described herein with connected optical loads.

In some implementations, the respective AC current flow paths may correspond to complementary sloped currents in two laser loads, as depicted and described in more detail with regard to FIG. 5. For example, first AC current flow path 210 may have a positively sloped current into laser load 106, and second AC current flow path 220 may have a negatively sloped current into laser load 108. A resulting waveform output from laser load 106 and laser load 108 may be a rectangular waveform as a result of the complementary sloped currents received at laser load 106 and laser load 108. A configuration of the complementary sloped currents and the resulting rectangular waveform is controllable by tuning a value of a V2 voltage at second voltage source 116, which may cause an adjustment to an L1 inductor current at inductor 112.

In some implementations, the first AC current flow path 210 and second AC current flow path 220 may have high frequency ripple currents that are 180 degrees phase shifted from each other and opposite in amplitude (e.g., as a result of parasitic resonances). The 180-degree phase shift between the ripple currents results in the ripple currents cancelling each other when parasitic inductances in the respective AC current flow paths are equal. A result of the cancelling of the ripple currents is that a combined optical pulse may have a relatively flat top without ripples (e.g., a portion of the combined optical pulse at approximately 2 nanoseconds (ns) to approximately 6 ns and at approximately 12 ns to approximately 16 ns, as shown in FIG. 5).

As indicated above, FIG. 2 is provided as an example. Other examples may differ from what is described with regard to FIG. 2.

Figure 3:
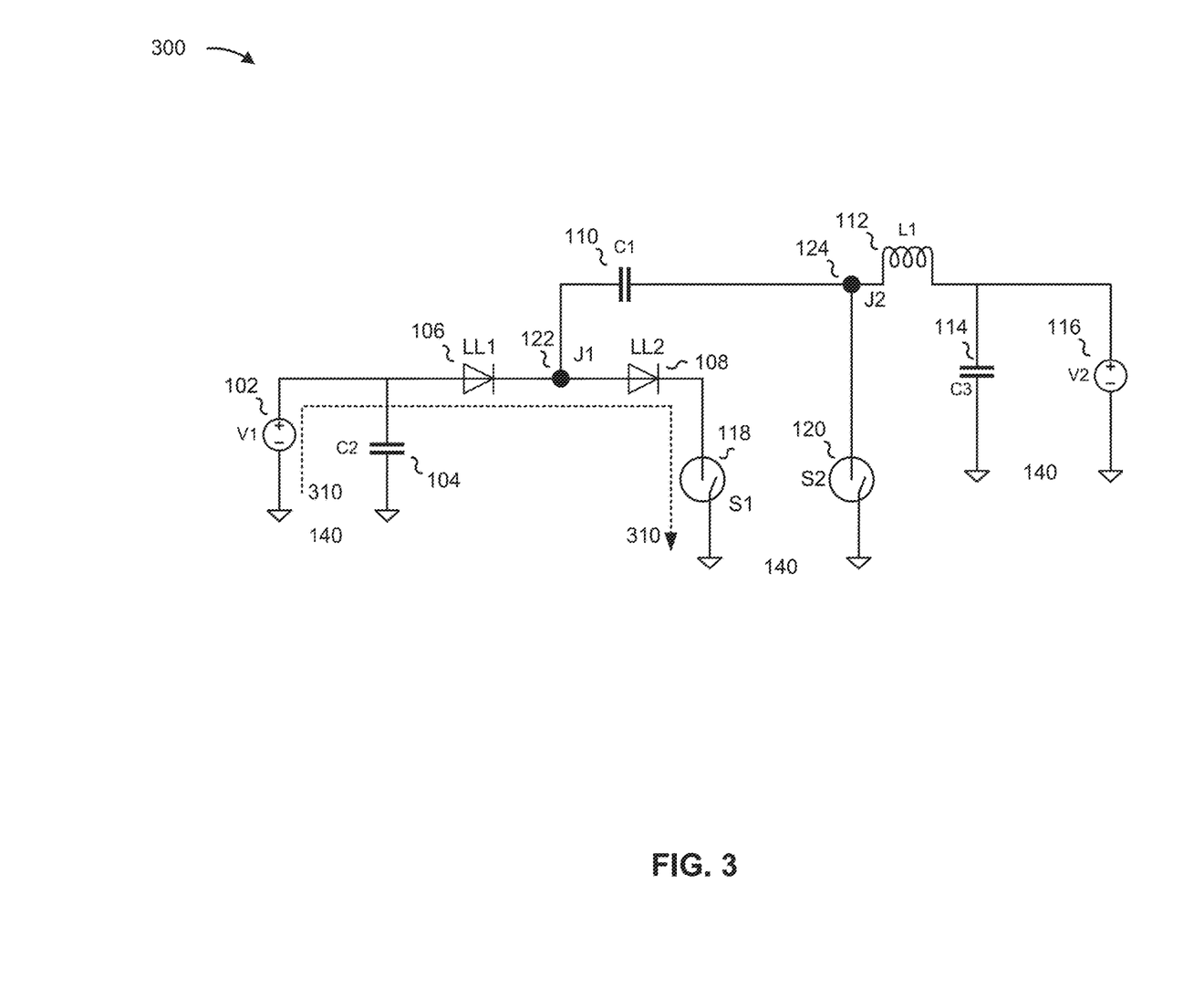

FIG. 3 is a diagram of an example 300 of a current flow through the electrical drive circuit 100 described herein with connected optical loads.

As shown in FIG. 3, electrical drive circuit 100 may have a DC current flow path 310. The DC current flow path 310 may extend from the common ground 140, to the first voltage source 102, to first laser load 106, to first electrical junction 122, to second laser load 108, to first switch 118, and to the common ground 140. In some implementations, the DC current flow path 310 may represent a DC current after discharge of inductor 112. For example, when first switch 118 is in an on state (e.g., closed) and second switch 120 is in an off state (e.g., opened), the first voltage source 102 may provide current through first laser load 106 and second laser load 108.

As indicated above, FIG. 3 is provided as an example. Other examples may differ from what is described with regard to FIG. 3.

Figure 4:
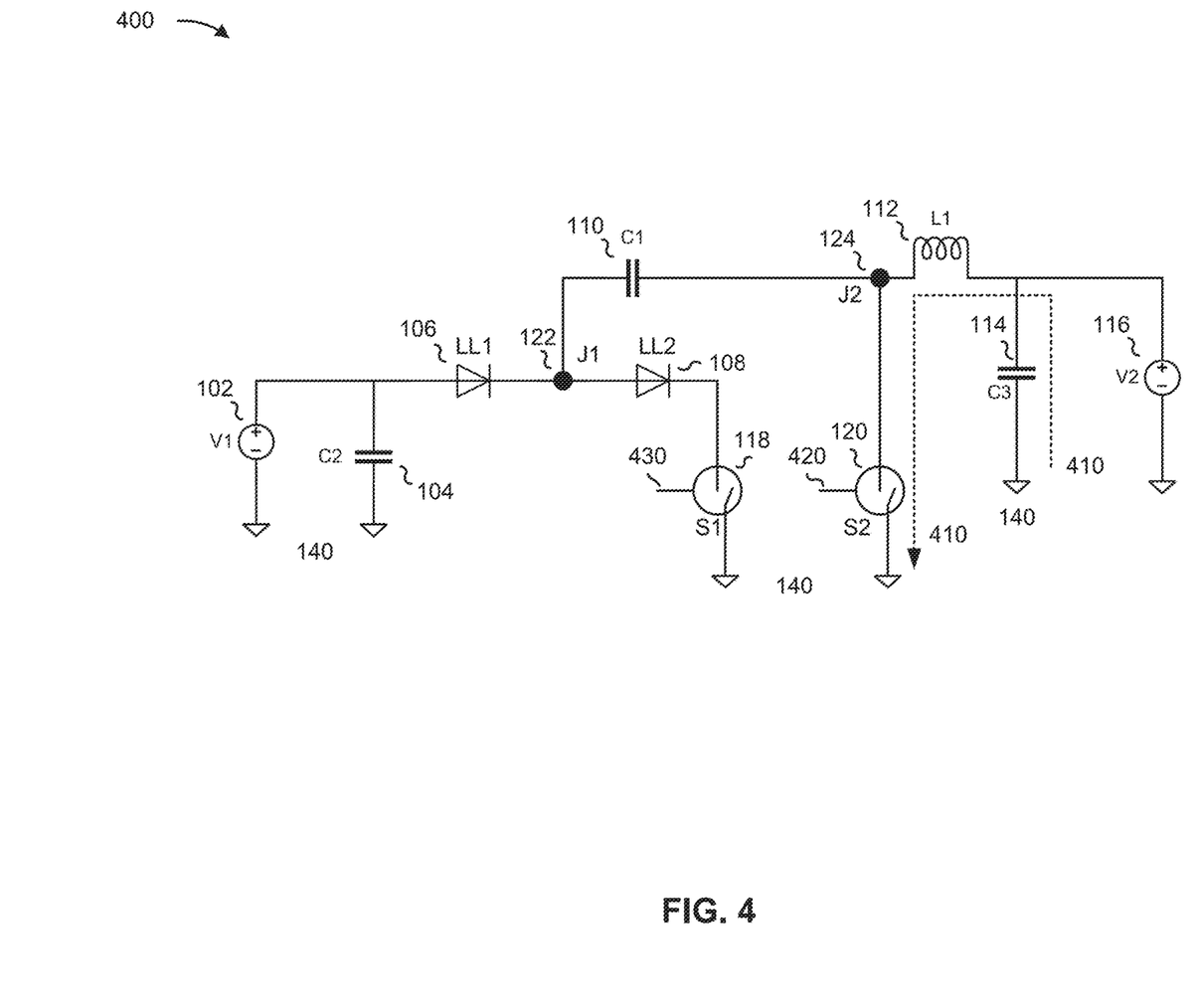

FIG. 4 is a diagram of an example 400 of a current flow through the electrical drive circuit 100 described herein with connected optical loads.

As shown in FIG. 4, electrical drive circuit 100 may have an inductor ripple current flow path 410. The inductor ripple current flow path 410 may extend from the common ground 140, to capacitor 114, to inductor 112, to second electrical junction 124, to second switch 120, to the common ground 140. In some implementations, inductor ripple current flow path 410 may represent an inductor charging current (an inductor charge current path). For example, when first switch 118 is in an off state (e.g., opened) and second switch 120 is in an on state (e.g., closed), inductor 112 stores energy. Second switch 120 may be associated with a first control voltage 420 (Vcharge) and first switch 118 may be associated with a second control voltage 430 (Vfire).

In some implementations, multiple cycles of changing states of switches 118/120 may be used to charge/discharge inductor 112. For example, when a cycle is defined as a first time when first switch 118 is in an off state (second control voltage 430 is not provided) and second switch 120 is in an on state (first control voltage 420 is provided) and a second time when first switch 118 is in an on state (second control voltage 430 is provided) and second switch 120 is in an off state (first control voltage 420 is not provided), electrical drive circuit 100 may experience two cycles to fully charge and discharge inductor 112. In some implementations, a magnitude of the supply voltages, V1(102) and V2(116), maybe based on a desired peak current in the laser loads 106/108.

Based on having a faster rise time, electrical drive circuit 100 may allow connected optical loads to reach an optical pulse peak in a shorter period of time, thereby enabling a faster optical pulse repetition rate to get the same spatial resolution relative to other electrical drive circuits. By reducing an amount of time to achieve a configured level of spatial resolution, electrical drive circuits described herein may have lower total power consumption than other electrical drive circuits that can be used in sensing systems. Moreover, by using inductor 112 as a current source and splitting inductor ripple current into two laser loads, an amount of pulse ripple is reduced relative to a resonant ripple that uses a compensating current as a current source. Based on reducing a level of ripple, electrical drive circuits described herein may be used without dumping circuitry, thereby reducing power consumption relative to other electrical drive circuits for which dumping is required.

As indicated above, FIG. 4 is provided as an example. Other examples may differ from what is described with regard to FIG. 4.

FIG. 5 is a diagram of example plots 500/510/520 of operation of an electrical drive circuit described herein with connected optical loads.

Example plot 500 shows a charging voltage and a discharging voltage in an electrical drive circuit described herein. For example, plot 500 shows a first control voltage 420 (Vcharge) and a second control voltage 430 (Vfire), which are provided by enabling/disabling switches 120 and 118, respectively. Vcharge corresponds to an inductor ripple current flow path 410. Vfire corresponds to DC current flow path 310. Example plot 510 shows an example of a current, I(C1), at capacitor 110 (a coupling capacitor disposed between first junction point 122 and second junction point 124). Example plot 520 shows an example of a first current, I(D1), at first laser load 106, a second current, I(D2), at second laser load 108, and a third current, I(D3), that is a net current of an electrical drive circuit described herein (e.g., at first laser load 106 and second laser load 108).

An optical power output can correspond to a current, thus, I(D1), I(D2), and I(D3), represent optical power outputs of a pulse from first laser load 106, second laser load 108, and a collective output of first laser load 106 and second laser load 108, respectively. For example, configurations of electrical drive circuits described herein (e.g., the presence of particular components, such as inductors or capacitors, among other examples) result in currents providing a net current that creates a square shaped pulse. In other words, a shape of an optical pulse provided as a net optical pulse by a first laser load and a second laser load, as described herein, corresponds to a shape of a net current provided to the first laser load and the second laser load.

As shown in FIG. 5, at a first time, t0, the first control voltage 420 (Vcharge) may be at a configured value (e.g., 5.0 volts (V)) and the second control voltage 430 (Vfire) may be zeroed out (e.g., 0 V). In this state, inductor 112 may charge in connection with inductor ripple current flow path 410. For example, at t0, first switch 118 may be in an off state, and second switch 120 may be in an on state. In some implementations, voltage sources 102 and 116 may provide a voltage of 1 V, 4 V, up to 10 V, or up to 30 V, among other examples. In some implementations, first voltage source 102 may have a voltage of 4 V, and second voltage source 116 may have a voltage of 9 V (in this case, capacitor 110 may have a capacitance in the range of 100 to 1500 picofarads (pF) and inductor 112 may have an inductance value in the range of 0.5 to 5 nanohenries (nH)). The voltage level may be configured based, at least in part, on a desired peak laser current, and a ratio of a magnitude of a first voltage from the first voltage source 102 to a magnitude of a second voltage from the second voltage source 116 may be configured to achieve a square shaped pulse in connection with a design of an electrical drive circuit described herein.

At a second time, t1, the first switch 118 may be in an on state, and the second switch 120 may be in an off state. The first control voltage 420 (Vcharge) may be zeroed out and the second control voltage 430 (Vfire) may be at the configured value. In this state, inductor 112 may discharge and current may flow to first laser load 106 and second laser load 108 in connection with currents of first AC current flow path 210, second AC current flow path 220. As shown in example plot 510, inductor current I(C1) at capacitor 110 is positive, resulting in inductor discharge current being forward biased (e.g., a ramp down) to second laser load 108 (e.g., which receives a majority of inductor discharge current). As shown in example plot 520, at t1, I(D2) current in second laser load 108 may rise to a maximum value with a fast rise time (e.g. 300 ps), while I(D1) current in first laser load 106 is at a minimum value.

Between t1 and a time t2 (when the switches 118/120 are reversed and the control voltages 420/430 are reversed), I(D2) current in second laser load 108 falls with a relatively slow fall time, and I(D1) current in first laser load 106 rises with a relatively slow rise time. As shown in example plot 510, the inductor current I(C1) at capacitor 110 changes from positive to negative, resulting in the first laser load 106 becoming forward biased and beginning to receive more current (e.g., a ramp up). This, in connection with selecting a ratio of the first and second voltage sources, results in a relatively flat I(D3) current, thereby resulting in a flat optical pulse.

At t2, I(D1) falls with a fast fall time resulting in an end to the flat optical pulse. Based on the fast rise time of I(D2) at t1 and the fast fall time of I(D1) at t2 (and the ratio of the first and second voltage sources), the flat optical pulse may have a rectangular shape.

In this case, as shown, electrical drive circuits described herein achieve a similar square shaped optical pulse to other types of laser drivers, with reduced electrical power losses relative to the other types of laser drivers. By achieving relatively short rise times at laser loads 106 and 108 (faster rise times than is achieved using other techniques), electrical drive circuits described herein enable a pulse peak to be achieved with a reduced pulse width relative to other techniques, which reduces power consumption and enables faster pulse repetition rate to achieve a particular level of resolution. Moreover, in addition to achieving relatively short rise times (e.g., of less than 100 ps), electrical drive circuits described herein may also achieve a relatively high modulation frequency (e.g., a modulation frequency of up to 200 MHz).

As indicated above, FIG. 5 is provided as an example. Other examples may differ from what is described with regard to FIG. 5.

Figure 6:
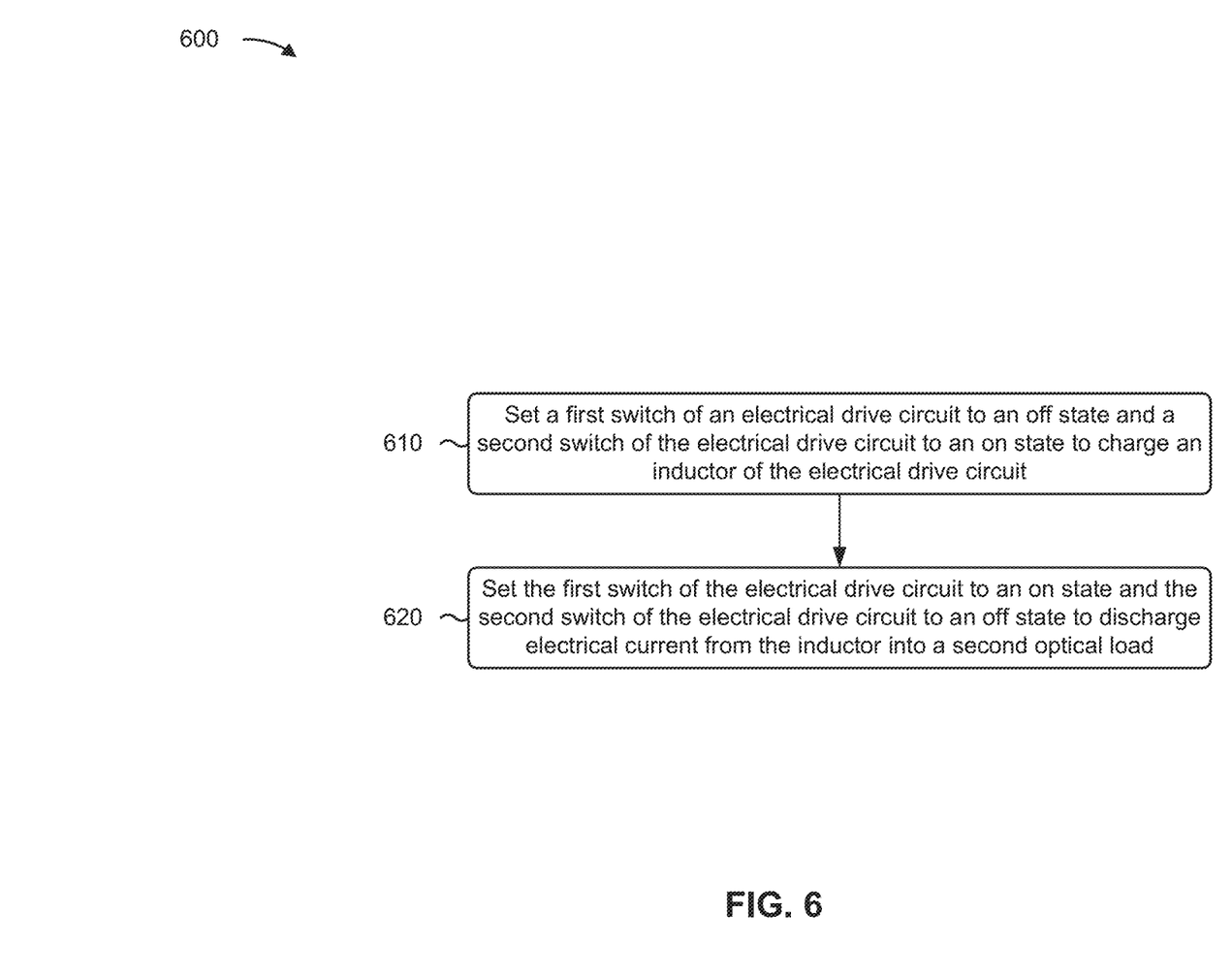
FIG. 6 is a flowchart of an example processes relating to driving optical loads to emit rectangular shaped optical pulses.

FIG. 6 is a flowchart of an example process 600 associated with driving optical loads to emit rectangular shaped optical pulses. In some implementations, one or more process blocks of FIG. 6 may be performed by a controller (e.g., one or more controllers connected to first switch 118 or second switch 120). For example, first switch 118 and second switch 120 may be connected to a single controller (e.g., with an inverter such that the single controller sets first switch 118 and second switch 120 to opposite states). Alternatively, first switch 118 may be connected to a first controller and second switch 120 may be connected to a second controller. In this case, the first controller and second controller may be synchronized to operate switches 118/120 and/or may be offset to account for signal delays to achieve a configured rise time and fall time.

As shown in FIG. 6, process 600 may include setting a first switch of an electrical drive circuit to an off state and a second switch of the electrical drive circuit to an on state to charge an inductor of the electrical drive circuit (block 610). For example, the controller may set a first switch of an electrical drive circuit to an off state and a second switch of the electrical drive circuit to an on state to charge an inductor of the electrical drive circuit, as described above. In some implementations, a single controller may control both the first switch and the second switch. In this case, the single controller may cause the first switch and the second switch to change respective states at approximately the same time, such as within approximately hundreds of picoseconds (less than 1000 picoseconds, less than 500 picoseconds, or less than 300 picoseconds, among other examples). Additionally, or alternatively, a plurality of controllers may cause the first switch and the second switch to change state. For example, a first controller may be synchronized with a second controller to cause the respective switches to change state at approximately the same time.

As further shown in FIG. 6, process 600 may include setting the first switch of the electrical drive circuit to an on state and the second switch of the electrical drive circuit to an off state to discharge electrical current from the inductor into a second optical load (block 620). For example, the controller may set the first switch of the electrical drive circuit to an on state and the second switch of the electrical drive circuit to an off state to discharge electrical current from the inductor into a second optical load, as described above. In some implementations, the inductor is connected between a second electrical junction and a second voltage source, such that: a first alternating current flows through a first auxiliary capacitor, a first optical load, a coupling capacitor, the inductor and a second auxiliary capacitor, and a second alternating current flows through the second auxiliary capacitor, the inductor, the coupling capacitor, the second optical load, and the first switch.

Process 600 may include additional implementations, such as any single implementation or any combination of implementations described below and/or in connection with one or more other processes described elsewhere herein.

In a first implementation, the second optical load is associated with a negatively sloped current during a rise time of an optical pulse and the first optical load is associated with a positively sloped current during the rise time of the optical pulse, such that an output of the first optical load and the second optical load is a square waveform.

In a second implementation, alone or in combination with the first implementation, setting the first switch of the electrical drive circuit to the off state and the second switch of the electrical drive circuit to the on state includes causing an inductor charge current to flow through the voltage source, the inductor, and the second switch, wherein the voltage source and the second switch are connected to a common ground, and wherein the second auxiliary capacitor is connected to the common ground and in parallel with the voltage source.

In a third implementation, alone or in combination with one or more of the first and second implementations, setting the first switch of the electrical drive circuit to the on state and the second switch of the electrical drive circuit to the off state includes causing a direct current to flow through another electrical source, the first optical load, the second optical load, and the first switch, wherein the other electrical source and the first switch are connected to a common ground, and wherein the first auxiliary capacitor is connected to the common ground and in parallel with the other electrical source.

Although FIG. 6 shows example blocks of process 600, in some implementations, process 600 may include additional blocks, fewer blocks, different blocks, or differently arranged blocks than those depicted in FIG. 6. Additionally, or alternatively, two or more of the blocks of process 600 may be performed in parallel.

The foregoing disclosure provides illustration and description, but is not intended to be exhaustive or to limit the implementations to the precise forms disclosed. Modifications and variations may be made in light of the above disclosure or may be acquired from practice of the implementations. Furthermore, any of the implementations described herein may be combined unless the foregoing disclosure expressly provides a reason that one or more implementations may not be combined.

It will be apparent that systems and/or methods described herein may be implemented in different forms of hardware, firmware, or a combination of hardware and software. The actual specialized control hardware or software code used to implement these systems and/or methods is not limiting of the implementations. Thus, the operation and behavior of the systems and/or methods are described herein without reference to specific software code—it being understood that software and hardware can be designed to implement the systems and/or methods based on the description herein.

As used herein, satisfying a threshold may, depending on the context, refer to a value being greater than the threshold, greater than or equal to the threshold, less than the threshold, less than or equal to the threshold, equal to the threshold, not equal to the threshold, or the like.

Even though particular combinations of features are recited in the claims and/or disclosed in the specification, these combinations are not intended to limit the disclosure of various implementations. In fact, many of these features may be combined in ways not specifically recited in the claims and/or disclosed in the specification. Although each dependent claim listed below may directly depend on only one claim, the disclosure of various implementations includes each dependent claim in combination with every other claim in the claim set. As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiple of the same item.

No element, act, or instruction used herein should be construed as critical or essential unless explicitly described as such. Also, as used herein, the articles "a" and "an" are intended to include one or more items, and may be used interchangeably with "one or more." Further, as used herein, the article "the" is intended to include one or more items referenced in connection with the article "the" and may be used interchangeably with "the one or more." Furthermore, as used herein, the term "set" is intended to include one or more items (e.g., related items, unrelated items, or a combination of related and unrelated items), and may be used interchangeably with "one or more." Where only one item is intended, the phrase "only one" or similar language is used. Also, as used herein, the terms "has," "have," "having," or the like are intended to be open-ended terms. Further, the phrase "based on" is intended to mean "based, at least in part, on" unless explicitly stated otherwise. Also, as used herein, the term "or" is intended to be inclusive when used in a series and may be used interchangeably with "and/or," unless explicitly stated otherwise (e.g., if used in combination with "either" or "only one of").

What is claimed is:

1. An electrical drive circuit, comprising:
   a first optical load terminal connected to an anode of a first optical load;
   a junction section that includes a first electrical junction and a second optical load terminal connected to a cathode of the first optical load and an anode of a second optical load;
   a third optical load terminal connected to a cathode of the second optical load;
   a first switch connected between the third optical load terminal and a common ground;
   a coupling capacitor connected between the first electrical junction and a second electrical junction;
   a second switch connected from a first branch of the second electrical junction and between the second electrical junction and the common ground; and
   an inductor connected from a second branch of the second electrical junction and between the second electrical junction and the common ground.

2. The electrical drive circuit of claim 1, further comprising:
   a first voltage source connected between the common ground and the first optical load terminal; and
   a second voltage source, on the second branch of the second electrical junction, connected between the inductor and the common ground.

3. The electrical drive circuit of claim 2, wherein a direct current path includes the first voltage source, the first optical load terminal, the first optical load, the second optical load terminal, the second optical load, the third optical load terminal, and the first switch.

4. The electrical drive circuit of claim 2, further comprising:
   an auxiliary capacitor connected to the common ground and in parallel with the first voltage source.

5. The electrical drive circuit of claim 2, wherein an inductor charge current path includes the second voltage source, the inductor, and the second switch.

6. The electrical drive circuit of claim 2, further comprising:
   an auxiliary capacitor, in the second branch, connected to the common ground and in parallel with the second voltage source.

7. The electrical drive circuit of claim 1, wherein an alternating current path includes the first optical load terminal, the first optical load, the second optical load terminal, the coupling capacitor, and the inductor.

8. The electrical drive circuit of claim 1, wherein an alternating current path includes the inductor, the coupling capacitor, the second optical load terminal, the second optical load, the third optical load terminal, and the first switch.

9. An electrical drive circuit, comprising:
   a first optical load terminal connected to an anode of a first optical load;
   a first electrical junction point that comprises a second optical load terminal connected to a cathode of the first optical load and connected to an anode of a second optical load;
   a third optical load terminal connected to a cathode of the second optical load;
   a first electrical path from a common ground, through a first auxiliary capacitor, the first optical load terminal, the first electrical junction point, a coupling capacitor, a second electrical junction point, an inductor, a second auxiliary capacitor and back to the common ground;
   a second electrical path from the common ground through the second auxiliary capacitor, the inductor, the second electrical junction point, the coupling capacitor, the first electrical junction point, the second optical load, the third optical load terminal, and a first switch, and back to the common ground; and
   a second switch connected between the second electrical junction point and the common ground.

10. The electrical drive circuit of claim 9, wherein the electrical drive circuit is configured to achieve a first rise time in the first optical load and a second rise time in the second optical load, and
    wherein the first rise time and the second rise time are based at least in part on control of the first switch and the second switch.

11. The electrical drive circuit of claim 9, wherein the first optical load is associated with a first optical power and the second optical load is associated with a second optical power that is approximately equal to the first optical power.

12. The electrical drive circuit of claim 9, wherein the first optical load is associated with a first quantity of emitters and the second optical load is associated with a second quantity of emitters that is approximately equal to the first quantity of emitters.

13. The electrical drive circuit of claim 9, wherein the second switch, when closed, charges the inductor.

14. The electrical drive circuit of claim 9, wherein the second switch, when opened, supplies an inductor current into the second optical load through the coupling capacitor.

15. The electrical drive circuit of claim 9, wherein the first optical load and the second optical load are driven to output an optical pulse with a square wave shape.

16. The electrical drive circuit of claim 9, wherein the first electrical path is a first alternating current electrical path and the second electrical path is a second alternating current electrical path.

17. A method, comprising:
    setting, by a controller, a first switch of an electrical drive circuit to an off state and a second switch of the electrical drive circuit to an on state to charge an inductor of the electrical drive circuit; and
    setting, by the controller, the first switch of the electrical drive circuit to an on state and the second switch of the electrical drive circuit to an off state to discharge the inductor,
    wherein the inductor is connected between an electrical junction and a voltage source, such that:
       a first alternating current flows through a first auxiliary capacitor, a first optical load, a coupling capacitor, the inductor and a second auxiliary capacitor, and
       a second alternating current flows through the second auxiliary capacitor, the inductor, the coupling capacitor, a second optical load, and the first switch.

18. The method of claim 17, wherein the second optical load is associated with a negatively sloped current during a rise time of an optical pulse and the first optical load is associated with a positively sloped current during the rise time of the optical pulse, such that an output of the first optical load and the second optical load is a square waveform.

19. The method of claim 17, wherein setting the first switch of the electrical drive circuit to the off state and the second switch of the electrical drive circuit to the on state comprises:
- causing an inductor charge current to flow through the voltage source, the inductor, and the second switch,
  - wherein the voltage source and the second switch are connected to a common ground, and
  - wherein the second auxiliary capacitor is connected to the common ground and in parallel with the voltage source.

20. The method of claim 17, wherein setting the first switch of the electrical drive circuit to the on state and the second switch of the electrical drive circuit to the off state comprises:
- causing a direct current to flow through another electrical source, the first optical load, the second optical load, and the first switch,
  - wherein the other electrical source and the first switch are connected to a common ground, and
  - wherein the first auxiliary capacitor is connected to the common ground and in parallel with the other electrical source.

* * * * *